United States Patent [19]

Magnusson

[11] Patent Number: 5,767,751

[45] Date of Patent: Jun. 16, 1998

[54] AUTOMATIC GAIN CONTROL FOR PULSE AMPLITUDE MODULATED SIGNALS

[75] Inventor: Per Magnusson, Hazlet, N.J.

[73] Assignee: Lucent Technologies Inc., Murray Hill, N.J.

[21] Appl. No.: 787,836

[22] Filed: Jan. 23, 1997

[51] Int. Cl.[6] .................................. H03C 1/00; H03D 1/00; H03K 7/02; H03K 9/02

[52] U.S. Cl. ........................... 332/115; 329/311; 375/353

[58] Field of Search .......................... 332/115, 116; 329/311; 375/268–270, 296, 300, 301, 320, 321, 353; 327/178–180

[56] References Cited

U.S. PATENT DOCUMENTS

| | | | |
|---|---|---|---|
| 3,080,524 | 3/1963 | Davey et al. | 332/116 X |
| 3,887,875 | 6/1975 | Shearer et al. | 327/179 |
| 5,469,127 | 11/1995 | Hulick et al. | 332/151 X |
| 5,699,383 | 12/1997 | Ichiyoshi | 375/296 X |

Primary Examiner—David Mis
Attorney, Agent, or Firm—Eugene J. Rosenthal

[57] ABSTRACT

The problem that signal levels may change slowly over time, e.g., as a result of ranges in temperature, is overcome by employing an automatic gain control feedback loop using a comparator, hereinafter referred to as a feedback slicer, connected to the output of a programmable gain amplifier to determine whether the output of the programmable gain amplifier is higher or lower than the desired signal level to which it is known to correspond. In particular, the decision level for the feedback slicer is set so that it is equal to the desired amplitude of a correctly amplified symbol. The gain of the programmable gain amplifier is adjusted, e.g., slowly over time, so that the amplitude of the amplified symbol hovers about that level. More than one signal level may be tracked. If so, each level tracked employs its own feedback slicer. Advantageously, the hardware for performing the automatic gain control is simplified, providing a cost reduction, and if implemented on a chip, a real estate savings may be realized as well.

4 Claims, 1 Drawing Sheet

AUTOMATIC GAIN CONTROL FOR PULSE AMPLITUDE MODULATED SIGNALS

TECHNICAL FIELD

This invention relates to compensating for slow changes in signal levels that may occur in an electronic system.

BACKGROUND OF THE INVENTION

A well known problem in the art of electronic communications is that signal levels may change slowly over time. Such changes may occur, for example, as a result of changes in temperature. Thus, even after establishing the correct levels upon initialization, some signals may need monitoring and adjusting in order to maintain proper system operation. This problem is particularly acute when a) using pulse amplitude modulated signals, as opposed to binary signals, and b) the analog-to-digital converter employed has only as many levels as the number of levels that can be transmitted for each symbol.

SUMMARY OF THE INVENTION

This problem is overcome, in accordance with the principles of the invention, by employing an automatic gain control feedback loop using one or more comparators, hereinafter referred to as feedback slicers, connected to the output of a programmable gain amplifier to determine whether the output of the programmable gain amplifier is higher or lower than the desired signal level to which it is known to correspond. In particular, the decision level for the feedback slicer is set so that it is equal to the desired amplitude of a correctly amplified symbol. The gain of the programmable gain amplifier is adjusted, e.g., slowly over time, so that the amplitude of the amplified symbol hovers about that level. More than one signal level may be tracked. If so, each level tracked employs its own feedback slicer. Advantageously, the hardware for performing the automatic gain control is simplified, providing a cost reduction, and if implemented on a chip, a real estate saving may be realized as well.

DETAILED DESCRIPTION

Figure 1:
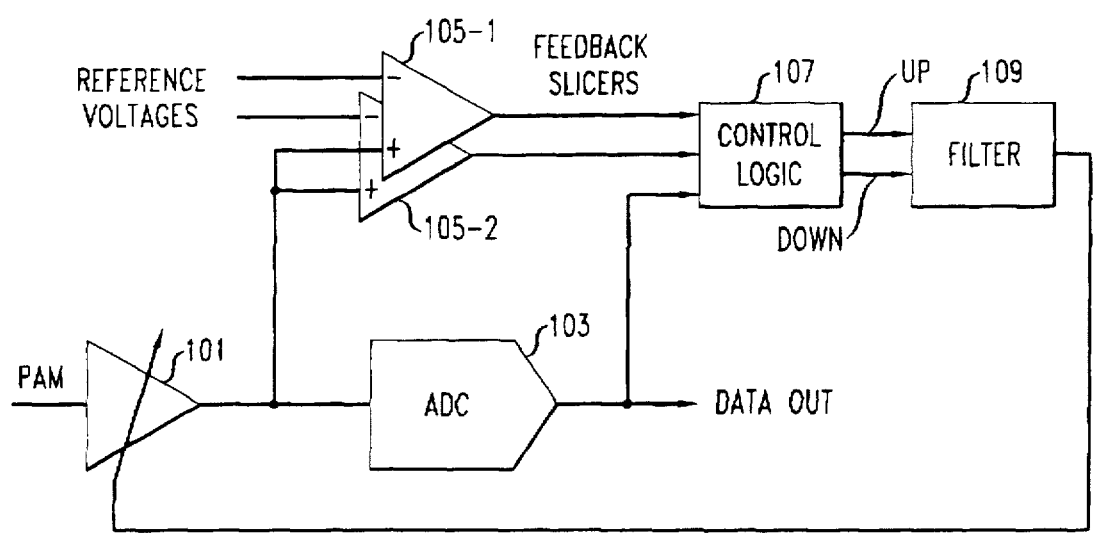
FIG. 1 shows an automatic gain control feedback loop for use with pulse amplitude modulated signals, in accordance with the principles of the invention.

FIG. 1 shows an automatic gain control feedback loop for use with pulse amplitude modulated signals, in accordance with the principles of the invention. Shown are programmable gain amplifier 101, analog-to-digital converter (ADC) 103, feedback slicers 105, including feedback slicers 105-1 and 105-2, control logic 107 and filter 109.

Programmable gain amplifier 101 is a substantially linear amplifier that amplifies received pulse amplitude modulated signals according to the gain factor at which it is set at any particular time. This gain is set to a level supplied from filter 109, which is developed as described hereinbelow. It is desired that amplifier 101 amplify the signals it receives as inputs so as to scale them to the correct one of a plurality of predetermined desired levels. For example, the desired levels may be either in between the ADC decision levels, or above or below the outermost ADC decision levels by one half the distance between the ADC decision levels. The values of such desired levels may change as a function of system operation, e.g., temperature, supply voltage, or the like.

The output of programmable gain amplifier 101 is supplied to ADC 103. Additionally, in the embodiment of FIG. 1, the output of programmable gain amplifier 101 is supplied to feedback slicers 105-1 and 105-2. For the example shown in FIG. 1, it is assumed that a four level pulse amplitude modulation code is employed. Therefore, ADC 103 is a 2-bit ADC, having three decision levels and four output levels. Furthermore, it is assumed that the entire system shown in FIG. 1 is operating so that the levels employed are substantially, although not necessarily exactly, correct. This state may have been brought about by prior training of the system. Such training is well known in the art. Thus, it is assumed that ADC 103 supplies as an output the correct code for the particular input it receives at any particular time. The output of ADC 103 may be supplied as the output of the receiver, or it may undergo further processing, e.g., error correction. The output of ADC 103 is also supplied to control logic 107.

Control logic 107 receives the output of ADC 103 and uses it to determine which, if any, of feedback slicers 105 it should employ. The feedback slicer to be employed is the one having as a reference voltage the voltage that corresponds to the received symbol. Each of feedback slicers 105 are arranged to indicate as an output whether the output from amplifier 101 is greater than or less than the particular reference voltage which is supplied to them. Each reference voltage is set equal to one of the desired levels which should be achieved by the output of amplifier 101. The voltages are set using well known circuit design techniques. For example, both ADC and the slicers derive their decision levels from a single voltage divider.

Control logic 107 reads the output of the feedback slicer it should employ and determines if the amplitude of the output of amplifier 101 is too high or too low. If the amplitude is too high, control logic 107 signals filter 109 that the gain of amplifier 101 should be reduced. Conversely, if the amplitude is too low, control logic 107 signals filter 109 that the gain of amplifier 101 should be increased.

Filter 107 acts as a low pass filter to smooth out the application of increase or decrease commands to amplifier 101. In this embodiment, the output of filter 107 is a digital representation of the gain to be employed by amplifier 101, and such an output is constantly being supplied to amplifier 101. Such a filter may be implemented by an up/down counter with particular bits of the counter specifying the gain level for programmable gain amplifier 101. However, those of ordinary skill in the art will recognize that an analog representation of the gain may be employed, or that only changes in the gain may be conveyed.

Note that, as the gain of amplifier 101 is assumed to be linear, it is not necessary to employ a slicer for each of the signal levels. If the number of slicers is to be limited to control costs, it may be advantageous to employ slicers for one or more of the outer symbol levels.

After reading copending, commonly assigned, United States Patent Application, Serial Number (case Larsson-Magnusson 5-1), which is incorporated herein by reference, one of ordinary skill in the art will recognize how to apply the principles of the invention to applications employing differential signals.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. An automatic gain control feedback circuit for use with a pulse amplitude modulated system, comprising:

an amplifier having a programmable gain;

an analog-to-digital converter (ADC);

a feedback slicer having a reference voltage equal to a desired level which should be achieved by the output of amplifier for a current output of the ADC;

wherein said programmable gain is indicated to be increased when said current amplifier output is determined by said feedback slicer to be less than said desired level and is indicated to be decreased when said current amplifier output is determined by said feedback slicer to be greater than said desired level.

2. The invention as defined in claim 1 further including a filter which filters said indications of increase or decrease.

3. The invention as defined in claim 2 wherein said filter is realized as a up/down counter.

4. The invention as defined in claim 2 wherein said filter is realized a digital filter.

* * * * *